United States Patent [19]

Consoli et al.

[11] Patent Number: 4,940,432
[45] Date of Patent: Jul. 10, 1990

[54] CONTACT ELEMENT FOR TEST SOCKET FOR FLAT PACK ELECTRONIC PACKAGES

[75] Inventors: John J. Consoli; Norman E. Hoffman, both of Harrisburg, Pa.

[73] Assignee: AMP Incorporated, Harrisburg, Pa.

[21] Appl. No.: 404,485

[22] Filed: Sep. 8, 1989

[51] Int. Cl.⁵ ............................................. H01R 23/72
[52] U.S. Cl. .................................. 439/862; 439/330; 439/72
[58] Field of Search .................................. 439/68–73, 439/525, 862, 816, 526, 330, 331

[56] References Cited

U.S. PATENT DOCUMENTS

| | | | |
|---|---|---|---|
| 3,393,396 | 7/1968 | Majewski | 439/525 |
| 4,341,433 | 7/1982 | Cherian et al. | 439/525 |
| 4,542,949 | 9/1985 | Tewes et al. | 439/70 |
| 4,786,256 | 11/1988 | Angeleri et al. | 439/72 |

Primary Examiner—Gary F. Paumen
Attorney, Agent, or Firm—Allan B. Osborne

[57] ABSTRACT

A conductive contact element for an electrical socket is disclosed. The contact element including a base section supporting a resilient, loop-shaped beam section having a free end which engages a fixed end as the beam is compressed. The engaging surfaces on the beam section are on the edges of the beam section.

8 Claims, 4 Drawing Sheets

CONTACT ELEMENT FOR TEST SOCKET FOR FLAT PACK ELECTRONIC PACKAGES

FIELD OF THE INVENTION

The subject invention relates to contact elements found in test sockets for electronic packages known as cerquad packages.

DESCRIPTION OF THE PRIOR ART

Electronic packages are generally tested to ensure proper functioning prior to being placed into use in a computer or the like. The testing oftentimes includes inserting the packages in sockets mounted on test boards and subjecting them to high temperatures while being operated. Because of the severity of this type of testing it is critical that the contact elements in the socket have high normal forces to prevent discontinuity between the elements and leads on the package. Further, the contact elements must exhibit low resistance and induction throughout the full compression range. One such prior art patent which discloses a socket possessing some of such favorable characteristics is U.S. Pat. No. 4,786,256. However, the constant normal force has been found to be too low for certain application. Accordingly, it is now proposed to provide a contact element for test socket having substantially higher normal forces.

SUMMARY OF THE INVENTION

According to the invention, a conductive contact element for an electrical socket is provided. The contact element includes an elongated base section from which one or more leads extend away from one edge and from which a beam section extends away from an opposite edge. The beam section is of a generally looped shape with one end attached to a base edge and with another end extending towards the first end. The beam section is collapsible whereupon an edge of the other end engages an edge of the first end.

DESCRIPTION OF THE INVENTION

Figure 1:
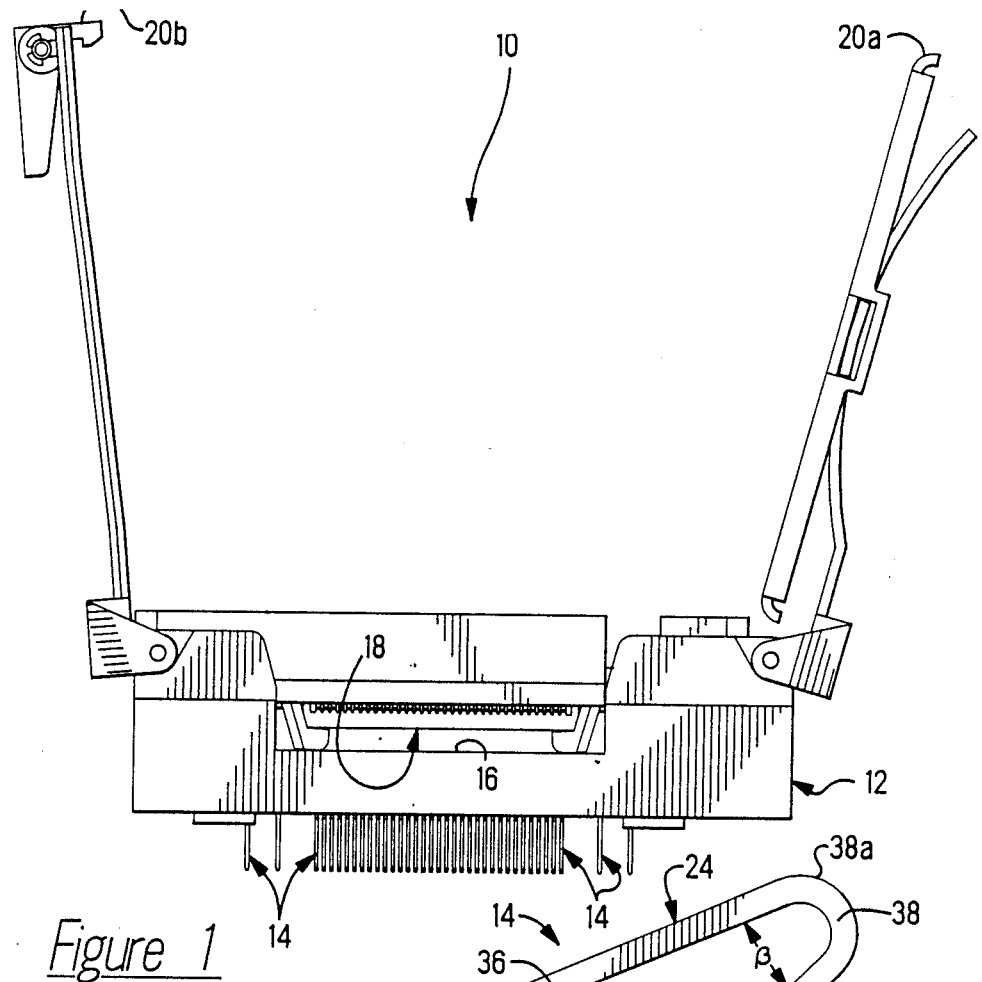
FIG. 1 is a side view of a test socket employing the contact element of the present invention.
Figure 2:
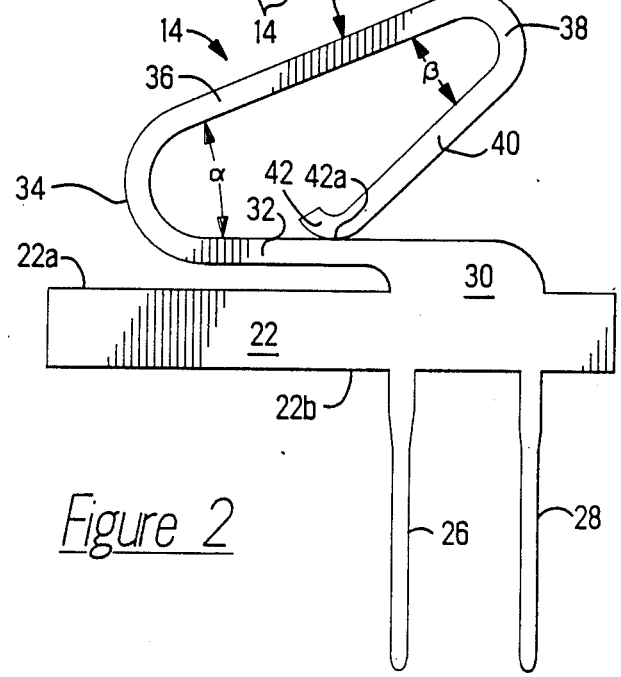
FIG. 2 is a side view of the contact element.
Figure 5:
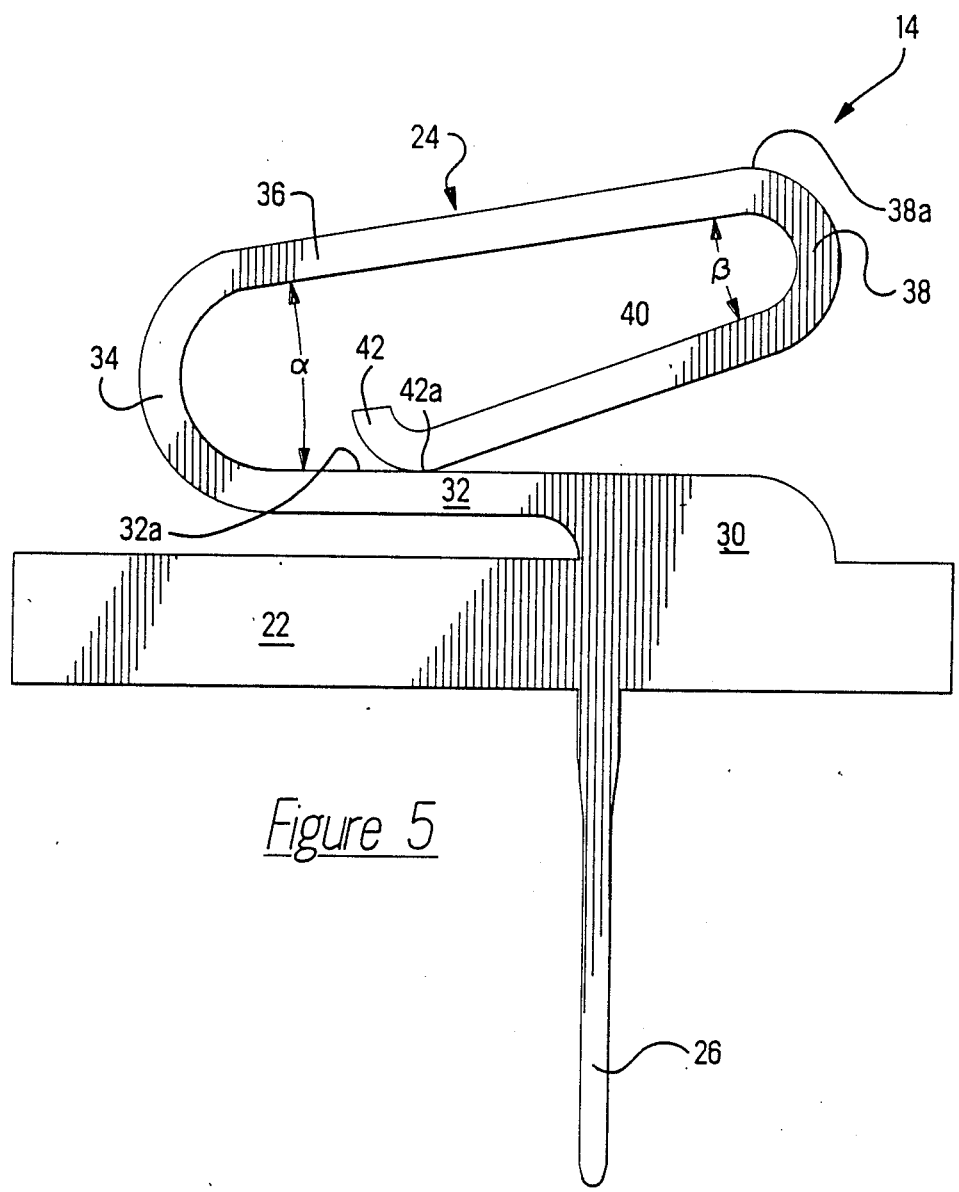
FIG. 5 is a side view of the contact element as compressed in the closed socket.

Socket 10 shown in FIG. 1, as well as FIGS. 5 and 6, includes housing 12 having contact elements 14 of the present invention positioned therein. Elements 14 are spaced around the perimeter of cavity 16 which receives electronic package assembly 18. Socket 10 also includes a cover 20 having cooperating first and second members 20a, 20b respectively with each member being pivotally hinged on opposite sides of housing 12.

Contact element 14, shown in FIGS. 2 through 5 includes base section 22, beam section 24 and leads 26, 28. Base section 22 is of an elongated, flat shape and supports beam section 24 on first edge 22a. Leads 26,28 are attached to and extend away from second edge 22b.

Beam section 24 includes several distinct segments or portions which cooperate to provide the high normal force required to adequately test many electronic packages 18. Attachment portion 30 is attached to edge 22a and as shown, is considerably long to provide a rugged and stable attachment as well as to provide substantial electrical contact with base section 22 and leads 26,28. Extending away from portion 30 in parallel relation to and overlying base section 22 is elongated strip portion 32. First radiused portion 34 connects elongated first leg portion 36 with strap portion 32. As shown, leg portion 36 overlies and is oblique to strap portion 32. First leg portion 36 attaches to second radiused portion 38 which overlies first portion 30. A second leg portion 40 extends from second radiused portion 38 back towards base section 22 on an oblique angle relation thereto. Leg portion 40 terminates in an arcuate shaped free end 42 with convex surface 42a engaging edge 32a of strap portion 32. The angle alpha between strap portion 34 and first leg portion 36 is preferably about 23 degrees. The angle beta between first leg portion 36 and second leg portion 40 is preferably about 21 degrees.

Contact elements 14 are stamped and formed from a suitable conductive material such as beryllium cooper. The convex surface 38a of second radius portion 38 and convex surface 42a on free end 42 of second leg portion 40 are stamped out by fine edge blanking and are nickel plated thereafter prior to final forming which brings convex surface 42a in engagement with edge 32a. As is now evident, the contacting surfaces are on narrow edges rather than the wider surfaces of element 14.

Figure 3:
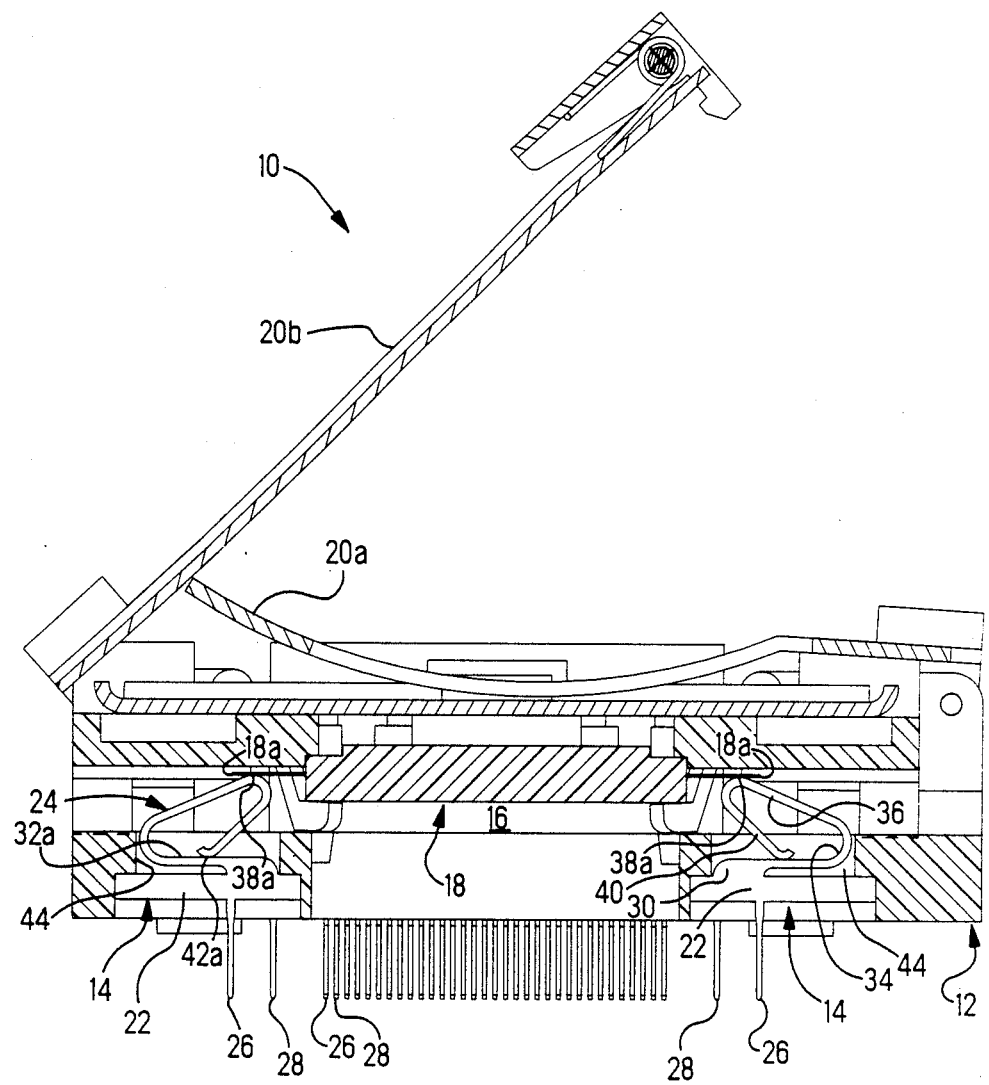
FIG. 3 is a side view of the socket partially showing the contact elements therein.

FIG. 3 is a side view of socket 10 showing the positioning of contact elements 14 therein. Note that adjacent elements 14 have had either lead 26 or 28 removed prior to being loaded into compartments 44. Elements 14 are inserted into the plastic socket housing 12 from below and heat staked in place.

FIG. 3 also shows electronic package assembly 18 in cavity 16 with cover member 20a closed down over it and cover member 20b being closed. Note that leads 18a of assembly 18 engage elements 14 along the second radius portion 38 and more particularly along the plated convex surface 38a.

As cover member 20a engages package 18, the aforementioned forces cause beam section 24 to compress so that convex surfaces 38a and 42a move along package leads 18a and edges 32a of strap portions 32 respectively. This wiping action enhances the electrical continuity between the engaging surfaces as is well known in the art.

Figure 4:
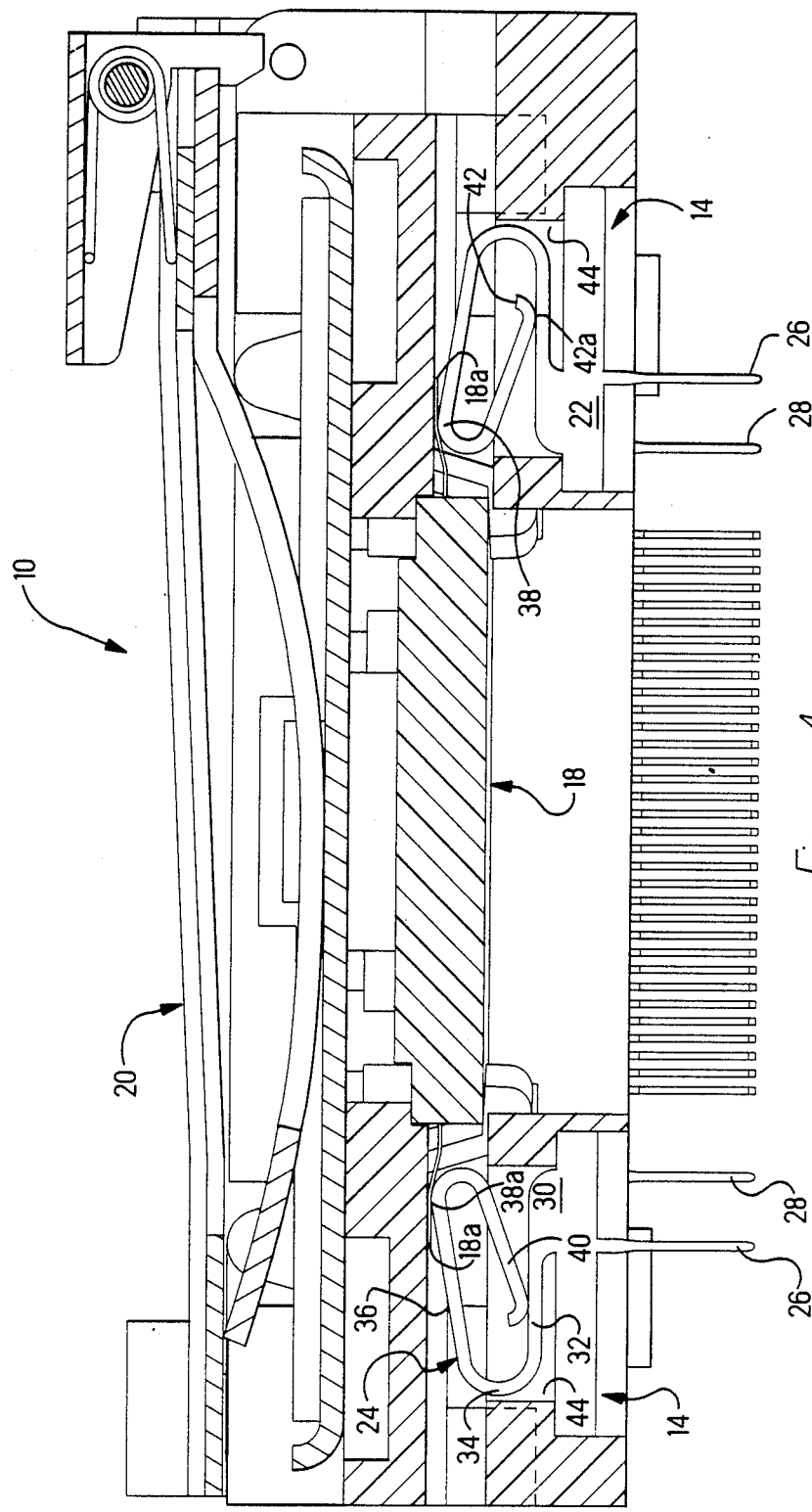
FIG. 4 is a side view of the socket closed.

FIG. 4 is a side view of socket 10 after cover 20 had been completely closed and latched. FIG. 5 is an enlarged view of a contact element 14 shown in FIG. 6. Elements 14 have been compressed to a predetermined position so as to exert the required normal force against leads 18a. As a comparison between FIGS. 2 and 5 will show, free end 42 of second leg portion 40 has moved further back along edge 32a and both leg portions 36,40 have become much closer to being parallel to strap portion 32. More particularly, angle alpha is now approximately 9½ degrees and angle beta is approximately 10½ degrees.

Test data indicate that contact elements 14 as designed will exert a normal force against leads 18a of about 207 grams plus and minus 28 grams. Further, the normal force between convex surface 42a and strap edge 32a is also about 207 grams. Should even higher forces be required within the same space, free end 42 of second leg portion 40 may be lengthened to engage first leg portion 36. Then as beam 24 is being compressed, free end 42 would slide along leg portion 36 to generate the higher forces.

In addition to generating high normal forces, contact elements 14 provide dual electrical paths between leads 18a and leads 26,28. The longer path is through first leg portion 36, first radius portion 34, strap 32 attachment 30 and base 22. The shorter path is through second leg portion 40, free end 42, attachment 30 and base 22. The dual paths reduce both the inductance and bulk resistance so that the electrical characteristics of elements 14 are very favorable and very well suited for use in test sockets which are used repeatedly in high temperature environments.

As can be discerned from the foregoing, a contact element for use in burn-in test sockets has been disclosed. The contact includes a relatively large base section which supports a beam section. The beam section includes a pair of leg portion which pivot under compression to develop substantially high normal forces. Further, the contacting surfaces of the beam section are on the edges as opposed to the wide surfaces.

We claim:

1. A contact element for use in electrical sockets, said element comprising:
    an elongated base section of a rectangular shape with narrow edges including first and second opposite edges;
    a lead extending outwardly from said first opposite edge, said lead adapted to electrically engage a circuit on a backplane;
    a plurality of connected portions forming generally a resilient, generally looped beam section, said portions including an attachment portion attached to and projecting away from said second opposite edge, a strap portion with one end attached to said attachment and extending away therefrom with an edge of said strap portion facing said second opposite edge on said base base section, a first radiused portion with one end thereof attached to another end of said strap portion, an elongated first leg portion with one end attached to another end of said first radiused portion and extending away therefrom at an oblique angle relative to and overlying said strap portion, a second radiused portion with one end attached to another end of said first leg portion, said second radiused portion being approximately in alignment with said attachment portion, an elongated second leg portion with one end attached to another end of said second radiused portion and extending away therefrom towards said strap portion, said second leg portion having an arcuate shaped free end with a convex surface thereon slidingly engaging an edge on said strap portion.

2. The contact element of claim 1 wherein said convex surface on said arcuate shaped free end is an edge of said beam section.

3. The contact element of claim 1 wherein the shape of the first radiused portion is such that the angle between said strap portion and said first leg portion is about 23 degrees.

4. The contact element of claim 1 wherein the shape of said second radiused portion is such that the angle between said first and second leg portion is about 21 degrees.

5. The contact element of claim 2 wherein said second radiused portion includes a convex surface which is an edge of said beam section, said convex surface adapted to electrically engage a lead on an electronic package which may be placed into the electrical socket.

6. The contact element of claim 5 wherein said convex surfaces on said arcuate shaped free end and said second radiused portion are plated.

7. A contact element for use in electrical sockets, said element comprising:
    an elongated and wide base section of thin stock providing a perimeter of narrow edges;
    at least one lead extending outwardly from one said narrow edge of said base section; and
    a generally looped beam section attached to another said narrow edge opposite to said one narrow edge, said beam section having first and second radiused portions separated by and attached to an elongated first leg portion, and a strap portion paralleling said base section and attached to and extending between said another narrow edge and said first radiused portion, said beam section further having a free end attached to said second radiused portion and extending towards said strap portion, said beam section being compressible whereupon an edge of said free end engages and slides along an edge of said strap portion.

8. The contact element of claim 7 wherein said beam section includes an elongated second leg portion attached to and extending between said second radiused portion and said free end.

* * * * *

UNITED STATES PATENT OFFICE
CERTIFICATE OF CORRECTION

Patent No. 4,940,432  Dated July 10, 1990

Inventor(s) John J. Consoli and Norman E. Hoffman

It is certified that error appears in the above-identified patent and that said Letters Patent is hereby corrected as shown below:

Claim 1, Column 3, Line 37 - the word --portion-- should follow the word "attachment".

Signed and Sealed this

Fourth Day of February, 1992

Attest:

HARRY F. MANBECK, JR.

*Attesting Officer*  *Commissioner of Patents and Trademarks*